United States Patent [19]
Gotoh et al.

[11] Patent Number: 5,820,994
[45] Date of Patent: Oct. 13, 1998

[54] LAMINATE AND METHOD FOR PREPARING SAME

[75] Inventors: Yumi Gotoh; Takehiro Miyashita; Tomoyuki Okamura; Fumiharu Yamazaki; Shin Fukuda, all of Kanagawa-ken; Nobuhiro Fukuda, Yamaguchi-ken; Yoko Tajiri; Noboru Kawasaki, both of Kanagawa-ken, all of Japan

[73] Assignee: Mitsui Chemicals, Inc., Tokyo, Japan

[21] Appl. No.: 796,889

[22] Filed: Feb. 6, 1997

[30] Foreign Application Priority Data

Feb. 16, 1996 [JP] Japan .................................. 8-029111
Sep. 19, 1996 [JP] Japan .................................. 8-247435
Sep. 24, 1996 [JP] Japan .................................. 8-251859
Sep. 24, 1996 [JP] Japan .................................. 8-251860
Sep. 25, 1996 [JP] Japan .................................. 8-252856

[51] Int. Cl.$^6$ .................................................. B32B 9/00
[52] U.S. Cl. ............... 428/451; 204/192.14; 204/192.15; 427/525; 427/527; 427/529; 427/530; 427/539; 427/579; 428/698; 428/699; 428/701; 428/702
[58] Field of Search ..................... 428/446, 451, 428/698, 699, 701, 702; 204/192.14, 192.15, 192.16; 427/525, 527, 529, 530, 539, 579

[56] References Cited

U.S. PATENT DOCUMENTS 5,589,252 12/1996 Matsuo et al. ......................... 428/216

FOREIGN PATENT DOCUMENTS 3-188263 8/1991 Japan .
3-188264 8/1991 Japan .

*Primary Examiner*—D. S. Nakarani
*Attorney, Agent, or Firm*—Burns, Doane, Swecker & Mathis, L.L.P.

[57] ABSTRACT

A laminate using a polymeric molded article as a substrate and having a light transparency, gas barrier properties and an excellent alkali resistance. The laminate is obtainable by carrying out a surface treatment to deposit an oxide of at least one metal selected from the metal elements of groups 2, 8, 9, 10 and 11 of the periodic table, and then forming a gas barrier layer such as oxides of silicon, nitrides of silicon and carbides of silicon on the treated surface. The gas barrier layer is not peeled off from the polymeric molded article even after being immersed in an alkali solution of pH 12 or more. The amount of the metal on the treated surface is preferably in the range of $5 \times 10^{14}$ atoms/cm$^2$ to $3 \times 10^{16}$ atoms/cm$^2$ in terms of the metal atoms per unit area. The practical performance of the laminate is not deteriorated during the patterning, by alkali etching, of a transparent conductive layer formed on the laminate.

17 Claims, 1 Drawing Sheet

LAMINATE AND METHOD FOR PREPARING SAME

BACKGROUND OF THE INVENTION

1. Field of the Invention

The present invention relates to a laminate including a polymeric molded article as a substrate and having gas barrier properties and an excellent alkali resistance, and a method for preparing the same. More specifically, it relates to a laminate in which a polymeric molded article is used as a substrate and a gas barrier layer is not peeled off even if the laminate is immersed in an alkali solution and which has transparency in a visible light range and a low gas permeability to gases such as oxygen and water vapor.

2. Description of the Prior Art

Transparent laminates including a polymeric molded article as a substrate and having gas barrier properties and alkali resistance have been preferably used in precision electronic instruments out of which oxygen, water vapor and other harmful gases should be kept, for example, portable telephones, PDAs (Personal Digital Assistants), notebook personal computers, EL (electroluminescence) displays and liquid crystal displays (LCDs), and these transparent laminates can preferably be used in liquid crystal display devices, inorganic EL display devices, organic EL display devices, organic EL lights and inorganic EL lights.

As the substrate for the liquid crystal display, a glass has heretofore been used, but in recent years, there has been suggested the employment of a polymeric molded article having characteristics such as lightweight, easy area enlargement, a high break resistance and excellent working properties. However, it has been elucidated that, in the case that the polymeric molded article is used as the substrate, oxygen and water vapor which permeate through the polymeric molded article lead to the performance deterioration of the liquid crystal device. In order to solve such a problem, it has been attempted that gas barrier properties are imparted to the polymeric molded article, and in addition, a transparent conductive layer is formed on the polymeric molded article and it is then used. In the course of this attempt, it has been apparent that the polymeric molded article to which the gas barrier properties are imparted is required to have chemical resistance, particularly alkali resistance, because an alkaline etching solution is usually used in patterning the transparent conductive layer.

The research on the transparent polymeric molded articles having the gas barrier properties has been conducted for a long period of time, and there have been suggested articles obtained by coating a resin having the excellent gas barrier properties such as polyvinylidene chloride or polyvinyl alcohol on a polypropylene film or a polyester film, and articles obtained by forming a thin film of silicon oxide or magnesium oxide on a polyester film by the utilization of vacuum deposition or a sputtering process. In addition, there have also been suggested articles in which a protective layer is formed on the gas barrier layer as needed, and articles in which another polymer film is laminated by the use of an adhesive for the purpose of further improving the gas barrier properties.

However, the present inventors have found that such conventional transparent polymeric molded articles having the gas barrier properties have some problems which will be described hereinafter. That is to say, with regard to the article coated with a resin, (1) the permeability of gases such as water vapor and oxygen depends largely upon temperature, and in particular, at a high temperature, the gas barrier properties are impaired, and (2) since an interaction between a resin material and a gas molecule is large, the presence of one gas has an influence on the permeability of another gas on occasion. For example, in the case of polyvinylidene chloride, the presence of water vapor has a noticeable influence on the permeability of oxygen.

Furthermore, with regard to the article coated with an inorganic substance such as silicon oxide, (1) when the gas barrier properties are heightened, the light transmittance deteriorates, (2) when the coating film is thin, sufficient gas barrier properties cannot be obtained, (3) when the coating film is thick, the adhesive force between the film and the substrate is low, and the article is brittle and its flexibility is lost, so that cracks are liable to occur at the time of working, (4) the article is weak in the alkali resistance, and the like.

As practical performances which are required for the transparent gas barrier polymeric molded article for use in the liquid crystal device or the like, it is desired that, for example, the article does not deteriorate when it is immersed at room temperature for 10 minutes in a 5 wt % aqueous sodium hydroxide solution or when it is immersed at 70° C. for 10 minutes in an etching solution ST-10 (made by Tokyo Ohka Kogyo Co., Ltd., a 35% monoethanolamine/diethylene glycol monobutyl ether solution) which is an organic alkali, and has a light permeability is 80% or more.

SUMMARY OF THE INVENTION

An object of the present invention is to provide a transparent laminate which contains a polymeric molded article as a substrate and which is excellent in gas barrier properties and which can withstand an alkali, and another object of the present invention is to provide a method for preparing the laminate.

The present inventors have intensively researched with the intention of solving the above-mentioned problems, and as a result, there have been found a laminate which contains a polymeric molded article as a substrate and which is transparent and excellent in gas barrier properties and which can withstand an alkali, and a method for preparing this laminate. In consequence, the present invention has been attained. The present invention is directed to a laminate obtained by carrying out a surface treatment to deposit an oxide of at least one metal selected from the group consisting of metals in the groups 2, 8, 9, 10 and 11 of the periodic table on at least one surface of a polymeric molded article, and then forming a gas barrier layer on the surface on which the surface treatment has been done, wherein the gas barrier layer is constituted of any of a layer mainly comprising an oxide of silicon, a layer mainly comprising a nitride of silicon and a layer mainly comprising a carbide of silicon, and the gas barrier layer is not peeled off from the polymeric molded article, even after immersed in an alkali solution of pH 12 or more.

In the present invention, the above-mentioned metal is typically magnesium, iron, cobalt, nickel or copper. Furthermore, the amount of the metal oxide to be deposited by the surface treatment is in the range of $5 \times 10^{14}$ atoms/cm$^2$ or more to $3 \times 10^{16}$ atoms/cm$^2$ in terms of an amount of a metal atom per unit area of the surface on which the surface treatment has been done. In addition, it is preferred that the gas barrier layer mainly comprises the oxide of silicon.

Moreover, a method for preparing the laminate of the present invention comprises a step of depositing at least one metal selected from the group consisting of metals in the groups 2, 8, 9, 10 and 11 of the periodic table or an alloy mainly comprising the metal on at least one surface of a polymeric molded article, and then treating it under an oxidizing atmosphere, whereby the one surface becomes a surface-treated surface on which an oxide mainly comprising the metal is deposited, and a step of forming a gas barrier layer constituted of any of a layer mainly comprising an oxide of silicon, a layer mainly comprising a nitride of silicon and a layer mainly comprising a carbide of silicon on the surface-treated surface. The layer mainly comprising the oxide of silicon can be preferably formed by, for example, a plasma CVD method of an organic silicon compound or a sputtering process. As the treatment under the oxidizing atmosphere, an oxygen plasma treatment can be preferably used.

DESCRIPTION OF THE PREFERRED EMBODIMENTS

Figure 1:
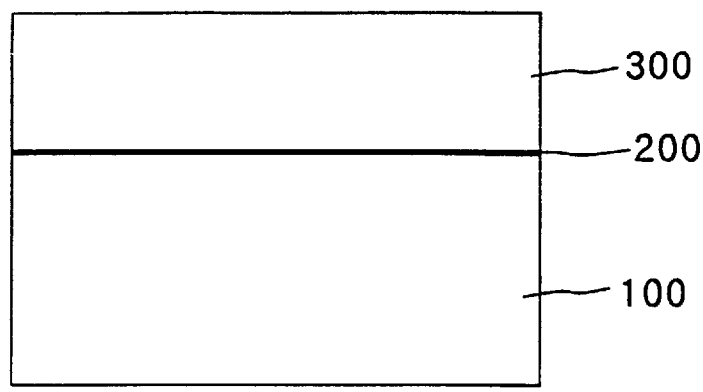
FIG. 1 is a sectional view showing a layer constitution of a laminate of a preferred embodiment according to the present invention.

A laminate shown in FIG. 1 can be obtained by depositing a metal oxide on one surface of a polymeric molded article 100 such as a polymer film to form a treated surface 200, and further forming a layer 300 mainly comprising oxides of silicon on the thus formed surface 200. The metal oxide constituting the treated surface 200 is an oxide mainly comprising a metal in the group 2, 8, 9, 10 or 11 of the periodic table. Thus, in this laminate, the oxide mainly comprising the metal in the group 2, 8, 9, 10 or 11 of the periodic table is present in the interface between the polymeric molded article 100 and the layer 300 mainly comprising the oxides of silicon.

Figure 2:
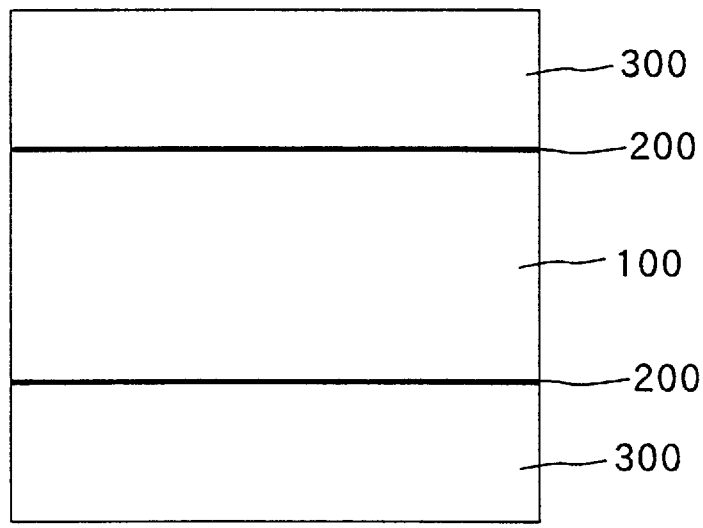
FIG. 2 is a sectional view showing a layer constitution of a laminate of another preferable embodiment according to the present invention.

Furthermore, a laminate shown in FIG. 2 can be obtained by depositing a metal oxide on both the surfaces of a polymeric molded article 100 to form treated surfaces 200, respectively, and further forming layers 300 mainly comprising the oxides of silicon on both the treated surfaces 200, respectively.

The layer 300 mainly comprising the oxides of silicon is formed as a gas barrier layer, but in the present invention, as each gas barrier layer, there can additionally be used a layer mainly comprising nitrides of silicon or a layer mainly comprising carbides of silicon.

In the present invention, no particular restriction is put on the polymeric molded article which is a substrate, but it is desirable that the article has transparency and a less hygroscopicity and its glass transition temperature is high to some extent. Typical examples of the polymeric molded article include polyesters, polyether sulfones (PES), polyether ether ketones (PEEK), polycarbonates (PC), polyolefins and resins having a three-dimensional crosslinking structure. "The resins having the three-dimensional crosslinking structure" referred to herein means resins having at least one of the structures represented by the following formulae (1) and (2);

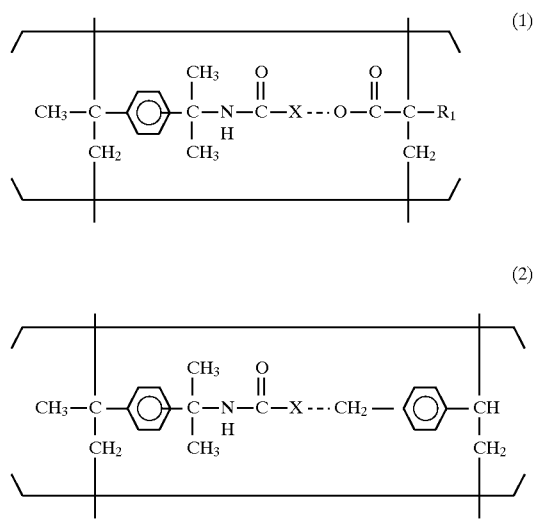

wherein X is an oxygen atom or a sulfur atom, and $R_1$ is a hydrogen atom or a methyl group.

Typical examples of the resins having the three-dimensional crosslinking structure include the following resin-a and resin-b.

The resin-a is a resin obtained by polymerizing a monomer (A) having both of a functional group represented by the following formula (3) and a functional group represented by the following formula (4) or (5) in one molecule.

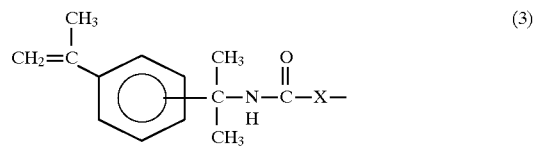

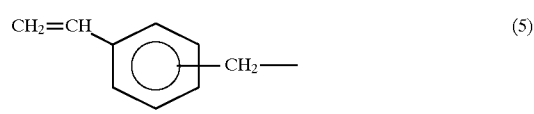

wherein $R_1$ is a hydrogen atom or a methyl group, and X is an oxygen atom or a sulfur atom.

The resin-b is a resin obtained by copolymerizing the above-mentioned monomer (A) with a monomer (B) having m (m is an integer of 1 to 6) functional group(s) of at least one kind selected from the group consisting of group represented by the following formulae (6) to (8)

The polymeric molded article can suitably take in the form of either a plate or a film. Its thickness is not particularly limited, but a thickness of 25 μm or more is desirable. Furthermore, on the surface of the polymeric molded article, another polymeric resin may be applied.

In the present invention, the surface treatment of the polymeric molded article is carried out by depositing, on the polymeric molded article, an oxide mainly comprising one or more metals selected from the group consisting of metals in the groups 2, 8, 9, 10 and 11 of the periodic table. In the present invention, the metals in the groups 2, 8, 9, 10 and 11 of the periodic table are metals represented by group numbers in accordance with IUPAC (International Union of Pure and Applied Chemistry) Nomenclature of Inorganic Chemical Revised Edition (1989). That is to say, examples of these metals include beryllium (Be), magnesium (Mg), calcium (Ca), strontium (Sr), barium (Ba), iron (Fe), ruthenium (Ru), osmium (Os), cobalt (Co), rhodium (Rh), iridium (Ir), nickel (Ni), palladium (Pd), platinum (Pt), copper (Cu), silver (Ag) and gold (Au). Above all, magnesium, iron, cobalt, copper, nickel, palladium, ruthenium and iridium are more preferable, and from a practical viewpoint, magnesium, iron, cobalt, copper and nickel are preferable.

The oxide mainly comprising the metal in the groups 2, 8, 9, 10 and 11 which is to be deposited on the polymeric molded article may be formed by depositing a simple substance of the metal or an alloy mainly comprising the metal on the polymeric molded article, and then treating it under an oxidizing atmosphere to convert the metal into an oxide mainly comprising the metal. Alternatively, the oxide mainly comprising the metal may be directly deposited on the polymeric molded article. A more suitable formation method comprises depositing metal atoms from the metal or the alloy mainly comprising the metal, and then treating it under an oxidizing atmosphere to convert the metal into an oxide mainly comprising the metal.

In the present invention, the alloy mainly comprising the metal means an alloy in which the content of the metal is high, preferably highest in the constitutional elements of the alloy. The oxide mainly comprising the metal means an oxide in which the content of the metal is high, preferably highest in the constitutional metal elements of the oxide.

As a technique of depositing the metal in the groups 2, 8, 9, 10 and 11 or the alloy mainly comprising the metal on the polymeric molded article, or forming the oxide mainly comprising the metal on the surface of the polymeric molded article, a dry film formation method (i.e., a dry process) such as a vacuum deposition method, an ion plating method, a sputtering process, an ion cluster beam method or a CVD (Chemical Vapor Deposition) method can be suitably utilized.

From the viewpoints of adhesive properties between the polymeric molded article and the oxide mainly comprising the metal in the groups 2, 8, 9, 10 or 11, the easiness of a post treatment by a plasma treatment or the like after the formation of the metal or the alloy mainly comprising the metal, and the formation easiness of the alloy of multi-component systems having different vapor pressures, the metal atom deposition method using the sputtering is more preferable. No particular restriction is put on the sputtering process, and there can be effectively used a DC sputtering process, a DC magnetron sputtering process, an RF sputtering process, an RF magnetron sputtering process, an ion beam sputtering process or an electronic cyclotron resonance (ECR) sputtering process.

No particular restriction is put on a power source for use in discharge at the time of the sputtering. In the case that a conductive target of iron, silver, an alloy or the like is used, DC or AC can be used, and in the case that an insulating target of an oxide or the like is used, AC can be used. As an AC frequency, for example, it is possible to use an optional frequency in the range of 20 Hz to 10 GHz, and the practically preferable frequencies are particularly 50 Hz and 60 Hz which are frequencies of a commercial electric power as well as 13.56 MHz, 27.12 MHz, 915 MHz and 2.45 GHz which are usable as ISM (industrial, scientific and medical use) bands in accordance with radio regulations. However, the values of the frequencies for plasma generation inclusive of this DC at the time of the sputtering do not impart restrictive conditions in the practice of the present invention. No particular restriction is put on an electric power for generating the plasma, and for example, the conditions of 1 mW/cm$^2$ to 100 W/cm$^2$ can preferably be used in power density conversion.

Next, as a preferable embodiment, in order to deposit the oxide mainly comprising at least one metal selected from the metals in the groups 2, 8, 9, 10 and 11 of the periodic table on the surface of the polymeric molded article, the metal or the alloy mainly comprising the metal is first formed by the use of the sputtering process, and then treated under an oxidizing atmosphere to form the oxide. This method will be described.

In the sputtering process, an argon (Ar) gas is usually introduced under a pressure of about 0.1 to 10 mTorr into a vacuum chamber, and this gas is used a sputtering gas, but in addition to the argon gas, as the sputtering gas, there may be used xenon (Xe), krypton (Kr), neon (Ne) or a mixed gas of these gases.

As the metals which can be used for a sputtering target, there can be used beryllium, magnesium, calcium, strontium, barium, iron, ruthenium, osmium, cobalt, rhodium, iridium, nickel, palladium, platinum, copper, silver and gold which are the metals in the groups 2, 8, 9, 10 and 11 of the periodic table, and alloys containing the metals in the groups 2, 8, 9, 10 and 11 can also be utilized. In addition to these metals, there can also be utilized alloys containing silicon (Si), titanium (Ti), vanadium (V), chromium (Cr), manganese (Mn), zinc (Zn), gallium (Ga), germanium (Ge), arsenic (As), selenium (Se), zirconium (Zr), niobium (Nb), molybdenum (Mo), indium (In), tin (Sn), antimony (Sb), tellurium (Te), hafnium (Hf), tantalum (Ta), tungsten (W), rhenium (Re), lead (Pb) and bismuth (Bi); rare earth metals such as scandium (Sc), yttrium (Y) and lanthanoids; and alkali metals such as lithium (Li), sodium (Na), potassium (K), rubidium (Rb) and cesium (Cs); and alloys containing two or more of these metals. That is to say, the alloy containing one or more of these metals and the metal in the group 2, 8, 9, 10 or 11 of the periodic table is utilizable. There can also be utilized an alloy obtained by adding another non-metal such as carbon (C), oxygen (O), nitrogen (N), phosphorus (P) or sulfur (S) to the alloy mainly comprising the metal in the group 2, 8, 9, 10 or 11. Moreover, the metal in the group 2, 8, 9, 10 or 11, or the alloy mainly comprising this metal can be formed by a sputtering process using a single target, a sputtering process using divided targets of two or more kinds, or a multi-sputtering process simultaneously using two or more targets. In the case that the alloy target is used, no particular restriction is put on the composition of the alloy target, and any composition is acceptable, so long as it permits the formation of the alloy mainly comprising the metal in the group 2, 8, 9, 10 or 11. No particular restriction is put on whether or not a composition ratio between the metal in the group 2, 8, 9, 10 or 11 and another metal is a stoichiometric ratio.

Typical examples of the alloy target which can be used in the present invention include Mg—Ge alloy, Mg—Ti alloy, magnesium silicide, Mg—Ag alloy, Mg—Li alloy, Mg—Al alloy, Mg—Al—Si alloy, Mg—Al—Cu alloy, Mg—Al—

Mn—Zn alloy, Mg—Zn—Zr alloy, Mg—Al—Mn alloy, Mg—Al—Li alloy, Mg—Zr—Ag alloy, Mg—Nb alloy, Mg—Ta alloy, JIS (Japanese Industrial Standard) magnesium alloy species 1, JIS magnesium alloy species 2, JIS magnesium alloy species 3, JIS magnesium alloy species 4, JIS magnesium alloy species 5 and JIS magnesium alloy species 6;

Cu—Ni alloy (white copper), Cu—Ni—Zn alloy (german silver, nickel silver), Cu—Sn alloy (phosphor bronze), CuZn—Sn alloy (tin brass), Cu—Zn alloy (brass), Cu—Zn—Pb alloy (lead-containing brass), Cu—Sn—Pb alloy (lead-containing bronze), Cu—Al alloy (aluminum bronze), Cu—Si alloy, Cu—Zn—Si alloy (silicon bronze), Cu—Sn—Mn alloy (Mn bronze), Cu—Be—Fe—Ni—Co alloy, Cu—Pb—Fe—Zn alloy, Cu—Al—Fe—Ni—Mn alloy, Cu—Ni—Fe—Mn alloy, Cu—Sn—Pb—Zn alloy, Cu—Be alloy and Cu—Ni—Co—Mn alloy (advance);

Ag—Pt alloy, Ag—Pd alloy, Ag—Ru alloy, Ag—Ir alloy, Ag—Os alloy, Ag—Rh alloy, Ag—Ni alloy, Ag—Co alloy, Ag—Fe alloy, Ag—Cu alloy, Ag—Ti alloy, Ag—Cr alloy and Ag—Nb alloy;

22-carat gold, 18-carat gold, 14-carat gold, 18-carat white gold, 14-carat pink gold, 14-carat yellow gold, 10-carat yellow gold, Au—Sn alloy, Au—Sb alloy, Au—Si alloy, Au—Ge alloy, Au—Be alloy, Au—Zn alloy, Au—Ga alloy, Au—Pd alloy and Au—Ge—Ni alloy;

Co—Fe alloy, Co—Cu alloy, Co—Ni alloy, Co—Cr alloy, Co—Cr—Fe alloy and Co—Cr—W alloy;

SUS201, SUS304, SUS317, SUS347 and the like which are austenite stainless steels; SUS403, SUS410, SUS431, SUS440A, SUS440F and the like which are martensite stainless steels; SUS429, SUS430F, SUS434 and the like which are ferritic stainless steels; SUS630, SUS631 and the like which are precipitation hardening stainless steels; Cr—Mo steel, Cr steel, Mn steel, Ni steel and carbon steel;

Mg—Ni alloy, Mg—Cu alloy, Nickel 200, Nickel 201, Nickel 210, Duranickel 301 ("Z" Nickel alloy), constantan (copper-45% nickel alloy) which is an alloy of nickel and copper, monel metals, Monel 400 (monel), R Monel, K Monel (Monel K-500), Monel 411, H Monel, S Monel (Monel 505); Nichrome V (Chromel A), Nichrome (Chromel C), Chromel P, alumel which are nichrome alloys; inconel, Inconel 610, Inconel 625, Inconel 705 and Ni—o—nel alloy which are nickel-chromium-iron alloys; permalloy and alloys prescribed by JIS, ASTM (American Society for Testing Materials) and the like. These alloys are easily available and can easily be utilized in the present invention.

The metal in the group 2, 8, 9, 10 or 11, or the alloy mainly comprising this metal which has been formed on the surface of the polymeric molded article as described above is treated under an oxidizing atmosphere to convert the metal or the alloy into an oxide mainly comprising the metal. Here, the treatment under the oxidizing atmosphere means a heat treatment in which the metal is exposed to an atmosphere containing oxygen, a treatment of exposing the metal to an atmosphere containing water, or a plasma treatment such as a nitrous oxide plasma treatment or an oxygen plasma treatment in which a gas containing oxygen is used. A treatment exposing the metal to an air atmosphere at room temperature is classified heat treatment. In the present invention, it is preferable to form the laminate by a dry film formation method, and therefore, as a method for treating the metal under the oxidizing atmosphere, the methods using the plasma treatments are preferable. Above all, the oxygen plasma treatment is a technique which can be most preferably used. That is to say, an oxygen gas is introduced into a vacuum chamber in which the polymeric molded article having the surface provided with the metal or the alloy thereon is placed, and the article is then exposed to a plasma produced by allowing electric power to flow through electrodes, whereby the metal is converted into the oxide to improve alkali resistance and transparency.

A gas which can be used to generate the plasma is introduced under a pressure in the range of 0.1 mTorr to atmospheric pressure, preferably 1 mTorr to 1 Torr into the vacuum chamber, and the electric power is applied to parallel plate electrodes or spiral electrodes arranged in the vacuum chamber, or induction electrodes arranged outside the vacuum chamber, whereby the plasma can be generated. It can easily be understood by a person skilled in the art that this plasma generation can easily be accomplished in a sputtering device or the vacuum chamber for use in vapor deposition. As a frequency which can be used to generate the plasma, it is possible to use, for example, 20 Hz to 10 GHz. The practically preferable frequencies are particularly 50 Hz and 60 Hz which are frequencies of a commercial electric power as well as 13.56 MHz and 915 MHz which are usable as ISM bands in accordance with radio regulations. However, the values of the frequencies for plasma generation inclusive of this DC do not give rise to any trouble in the practice of the present invention. No particular restriction is put on the electric power for generating the plasma, and for example, when the electric power is converted into a power density, 1 mW/cm$^2$ to 100 W/cm$^2$ can preferably be used. It can easily be understood by a person skilled in the art that plasma treatment conditions such as the pressure of the gas, a discharge power, a discharge frequency and a plasma treatment time for use in the plasma treatment can be suitably selected so as to obtain the suitable oxide.

When the metal simple substance of an element in the group 2, 8, 9, 10 or 11 or the alloy mainly comprising the metal is converted into the oxide mainly comprising the metal, the transparency to a visible light can be improved. However, if the amount of the metal or the alloy mainly comprising the metal formed on the polymeric molded article is large, the transparency of the obtained laminate deteriorates. On the other hand, if the amount of the metal or the alloy is small, the transparency is sufficient, but an adhesive force between the polymeric molded article and a layer mainly comprising oxides of silicon laminated on the oxide mainly comprising the metal is poor.

In the present invention, since the amount of the metal or the alloy mainly comprising the metal formed on the surface of the polymeric molded article is small, it cannot be considered that this metal has the same characteristics as the metal of a bulk. In the case that the formation is done by the use of the alloy target, the deposited alloy is different from the bulk alloy used as the target in characteristics, a composition ratio of the alloy and the like. Furthermore, it can be presumed that, on the surface of the polymeric molded article, the deposited metal or alloy is present in the form of islands instead of the formation of the layer, and it can also be presumed that the deposited alloys are present in the state of a mixture of the metals instead of the formation of the alloy. In the present invention, any morphology may be taken without any problem. The metal would not be in a complete metal state in the atmosphere and it would be partially present in an oxidizing state, but this is also acceptable without any problem.

The metal in the group 2, 8, 9, 10 or 11, or the alloy mainly comprising this metal is substantially exposed to the oxidizing atmosphere in the next step by the plasma or the like containing oxygen in laminating the layer mainly comprising the oxides of silicon on this metal or alloy without any specific treatment, and it can be sufficiently presumed that the same state as actually treated under the oxidizing atmosphere can be obtained. However, if the layer mainly comprising the oxides of silicon is directly laminated without intentionally carrying out the treatment under the oxidizing atmosphere to the metal or the alloy, the metal or the alloy mainly comprising this metal is scarcely converted into the oxide layer, depending upon the amount of the metal or the alloy, the kind of metal element contained in the alloy or the formation conditions at the time of the formation of the layer mainly comprising the oxides of silicon. In such a case, the light permeability of the laminate is very low, and adhesive properties to the oxides of silicon deteriorate, so that the alkali resistance is liable to decline. When the oxygen plasma treatment is carried out, the oxidation of the alloy proceeds, so that the transparent oxide having the good adhesive properties which is suitable for the laminate can be surely obtained. Therefore, it is preferred that after the metal or the alloy mainly comprising this metal is deposited on the polymeric molded article, the treatment is intentionally done under the oxidizing atmosphere.

On the other hand, in the case that the oxide mainly comprising at least one metal selected from the metal elements in the groups 2, 8, 9, 10 and 11 is directly formed on the polymeric molded article by the sputtering process, there is usually carried out a reactive sputtering using the same target as used to form the alloy on the polymeric molded article, or an oxide target. In the practice of the reactive sputtering, a mixed gas of an argon gas and an oxygen gas is used as a sputtering gas, and this mixed gas is introduced under a pressure of about 0.1 mTorr to 10 mTorr into the vacuum chamber. A ratio between argon and oxygen in the mixed gas depends upon conditions such as a metal atom deposition speed. For example, in the case that the metal or the alloy target is used, a partial pressure of oxygen to the total pressure is adjusted to 10 to 60%, and in the case that the oxide is used as the target, a partial pressure of oxygen to the total pressure is adjusted to 0 to 30%, whereby the oxide mainly comprising the metal in the present invention can suitably be formed. In place of the argon gas which can be used as the sputtering gas, there may be used xenon, krypton, neon or a mixture thereof.

In the case that the oxide is used as the target, an oxide of the metal in the group 2, 8, 9, 10 or 11 is utilizable, and typical examples of this oxide include ruthenium oxide ($Ru_2O$), rhodium oxide ($Rh_2O_3$), palladium oxide (PdO), osmium oxides ($OsO_2$ and $OsO_4$), iridium oxides ($Ir_2O_3$ and $IrO_2$), platinum oxides ($Pt \cdot nH_2O$: n is an integer of 0 to 4, and PtO), copper oxides (CuO and $Cu_2O$), silver oxides ($Ag_2O$ and AgO), gold oxide ($Au_2O_3$), magnesium oxide (MgO), nickel oxide (NiO), iron oxides (FeO, $Fe_2O_3$, $Fe_3O_4$ and the like), cobalt oxides (CoO, $Co_3O_4$ and $Co_2O_3 \cdot nH_2O$: n is an integer of 0 or more), mixtures of these oxides, and composite oxides thereof. Examples of the composite oxides include iron titanate ($FeTiO_3$), iron molybdate ($FeMoO_4$), iron tungstate ($FeWO_4$), cobalt tungstate ($CoWO_4$), cobalt molybdate ($CoMoO_4$), cobalt titanate ($CoTiO_3$), copper tungstate ($CuWO_4$), copper titanate ($CuTiO_3$), copper molybdate ($CuMoO_4$), copper selenate ($CuSeO_4$), silver molybdate ($AgMoO_4$), silver dichromate ($AgCrO_4$), silver tungstate ($Ag_2WO_4$), silver vanadate ($AgVO_3$), magnesium aluminate ($MgAl_2O_4$), magnesium-iron oxide ($MgFe_2O_4$), magnesium molybdate ($MgMoO_4$), magnesium stanate ($MgSnO_3$: $Mg_2SnO_4 + SnO_2$), magnesium titanate ($MgTiO_3$), magnesium tungstate ($MgWO_4$) and magnesium zirconate ($MgZrO_3$). Further examples of the usable oxides include oxides of the metals in the groups 2, 8, 9, 10 and 11 as well as the oxides of silicon, titanium, vanadium, chromium, manganese, zinc, gallium, germanium, arsenic, selenium, zirconium, niobium, molybdenum, indium, tin, antimony, tellurium, hafnium, tantalum, tungsten, rhenium, lead, bismuth; rare earth metals such as scandium, yttrium and lanthanoids; and alkali metals such as lithium, sodium, potassium, rubidium and cesium. Moreover, mixtures containing two or more of these oxides are also utilizable. The oxide mainly comprising the metal in the group 2, 8, 9, 10 or 11 can also be formed by a sputtering process using a single target, a sputtering process using divided targets of two or more kinds, or a multi-sputtering process simultaneously using two or more targets. In the case that the alloy target is used, no particular restriction is put on the composition of the alloy target, and any composition is acceptable, so long as it permits the formation of the oxide mainly comprising the metal. Furthermore, no particular restriction is put on whether or not a composition ratio between this metal and another metal is a stoichiometric ratio.

The amount of the oxide mainly comprising the metal in the group 2, 8, 9, 10 or 11 which can be deposited on the polymeric molded article is within such a range that the adhesive properties to the polymeric molded article and the transparency are sufficiently maintained and the alkali resistance is obtained. Since the amount of the oxide mainly comprising this metal is small, it cannot be considered that the oxide has the same characteristics as the oxide of a bulk. In the case that the composite oxide target is used, there is obtained the oxide which is different from the oxide used as the target in characteristics, a composition ratio of the contained metals and the like. Since the amount of the oxide mainly comprising the metal is very small, it can be presumed that the deposited oxide is present in the form of islands instead of the formation of the layer, and it can also be presumed that when a metal other than the above-mentioned metals is contained, the composite oxide is not formed and the oxides are present in the state of a mixture. In the present invention, any morphology may be taken without any problem.

Furthermore, after the oxide mainly comprising the metal in the group 2, 8, 9, 10 or 11 has been formed on the polymeric molded article, the oxide can be treated in the oxidizing atmosphere to further advance the oxidation. This step does not disturb the practice of the present invention, and on the contrary, it is preferable.

It can be confirmed by analysis using an X-ray photoelectron spectrometry (XPS) or an Auger electron spectroscopy (AES) that the oxide mainly comprising the metal in the group 2, 8, 9, 10 or 11 has been formed on the polymeric molded article, that the alloy mainly comprising this metal is formed, and whether or not the alloy is converted into the oxide.

The amount of the metal oxide deposited on the surface of the polymer can be denoted in terms of the amount of the metal atoms in the deposited metal oxide. The amount of the metal atoms is preferably $5 \times 10^{14}$ atoms/cm$^2$ to $3 \times 10^{16}$ atoms/cm$^2$, more preferably $1 \times 10^{15}$ atoms/cm$^2$ to $2 \times 10^{16}$ atoms/cm$^2$, most preferably $2 \times 10^{15}$ atoms/cm$^2$ to $2 \times 10^{16}$ atoms/cm$^2$. If the amount of the metal oxide deposited on the treated surface is too small, the alkali resistance which is intended by the present invention cannot be sufficiently obtained. On the other hand, if the amount of the metal oxide is too large, the light permeability deteriorates, and the adhesive force to the layer mainly comprising the oxides of silicon which is the gas barrier layer formed on the treated surface. In addition, the alkali resistance is also unpreferably poor.

As the prior art to the present invention, there have been a technique in which in order to heighten the adhesive properties between a plastic material and the metal oxide layer, a layer mainly comprising nickel oxide is laminated on a plastic surface, or a layer mainly comprising an oxide of zirconium, nickel or titanium is laminated on a plastic surface to which a low-temperature plasma treatment has been applied, and a metal oxide layer is further laminated thereon (e.g., Japanese Patent Application Laid-open Nos. 188263/1991 and 188264/1991). In any of these prior arts, the minimum thickness of the layer mainly comprising the oxide of nickel, zirconium or the like is not less than a thickness which permits the continuous film formation of the oxide, and typically, it is in the range of 15 nm to 1 μm. In the case of the laminate by this prior art, the adhesive force between the plastic material and the metal oxide can be improved, but the transparency which is required as the substrate for a liquid crystal display cannot be sufficiently obtained. In the present invention, the metal oxide is not formed as a layer, but a very small amount of the metal oxide is deposited on the surface of the polymeric molded article. Therefore, the transparency is not impaired, and the good adhesive force can also be obtained.

In the present invention, if the amount of the metal element in the metal oxide deposited on the surface of the polymeric molded article is converted to a film thickness on condition that the metal is formed on the polymeric molded article with a uniform thickness, the film thickness is in the range of about 0.2 to 3 nm, which is extremely thin. In the present invention, however, the metal oxide is not required to be in the form of the layer, but it may be in the form of islands, as described above. Therefore, it is not necessary to consider the metal oxide on the polymeric molded article in terms of the film thickness.

The amount of the metal oxide deposited on the surface of the polymeric molded article can be measured by a film thickness monitor or the like, but it can be presumed that the amount of the metal within the above-mentioned range is not such that the continuous film of the metal oxide is formed. Therefore, the film thickness can be determined by calculation on the basis of a surface treatment time, referring to a time required to form the film having a thickness of about 100 nm which is usually considered to be the continuous film. Typically, an atom number N per unit area of the deposited metal can be calculated in accordance with the equation $$N = D \cdot \rho \cdot N_A / M \quad (1)$$

wherein D is a thickness of the metal layer or the metal oxide layer deposited by carrying out the surface treatment for a time t under specific conditions, and ρ and M are a density and an atomic weight of the metal or the metal oxide, respectively, and $N_A$ is the Avogadro number.

In particular, if the unit of the film thickness D is nm, the unit of the density ρ is g/cm$^3$, and the unit of the amount N of the deposited metal is atoms/cm$^2$, the amount N of the deposited metal can be obtained by the equation $$N = D \cdot \rho \cdot 6.02 \times 10^{16} / M \quad (2)$$

Therefore, the deposition of the desired metal amount n (atoms/cm$^2$) on the surface can be accomplished by carrying out the surface treatment for a time represented by t·(n/N) under the same surface treatment conditions. In the case that the film thickness monitor using a quartz oscillator is used, the reduction of a frequency required to actually deposit the metal as much as n (atoms/cm$^2$) can be calculated by δf·(n/N), if the amount of the deposited metal is N (atoms/cm$^2$) when the reduction of the frequency observed is δf(Hz). As an actual calculation example, in the case the surface treatment is carried out with magnesium on the surface of a polycarbonate (PC) sheet and if a surface treatment time of 200 seconds is required to form the film having a thickness of 100 nm on the assumption that magnesium atoms are deposited in the form of the continuous film, the amount of deposited magnesium is about $4.3 \times 10^{17}$ atoms/cm$^2$ in accordance with the equation (2). Therefore, in order to deposit the magnesium atoms in an amount of $6 \times 10^{15}$ atoms/cm$^2$ on the PC sheet surface under the same conditions, the surface treatment is to be carried out for 2.8 seconds in accordance with 200 (sec)·[$6 \times 10^{15}$ (atoms/cm$^2$)]/[$4.3 \times 10^{17}$ (atoms/cm$^2$)]=2.8 (sec). This amount of the magnesium atoms, i.e., $6 \times 10^{15}$ (atoms/cm$^2$) corresponds to about 1 nm in terms of the film thickness on the assumption that magnesium is formed with a uniform thickness on the surface of the PC sheet.

The amount of the metal oxide deposited on the surface of the polymeric molded article can be measured by an X-ray photo-electron spectrometry (XPS), an Auger electron spectroscopy (AES), a Rutherford back scattering spectroscopy (RBS), an inductively coupled plasma (ICP) emission spectroscopy which is carried out after the dissolution of the deposited metal, a secondary ion mass spectroscopy (SIMS), a laser inductive fluorescent method (LIF) or an X-ray fluorescent analysis (XRF). For the strict quantitative analysis, the ICP and the RBS can be preferably used, but from a practical viewpoint, the XPS is preferable. When the measurement is actually done by XPS, the amount of the deposited metal is evaluated in consideration of an escape depth of photo-electrons. For example, if a surface concentration of magnesium by the XPS after the surface treatment with magnesium is 80%, since the average escape depth of the photo-electrons is 2 atomic layers, it can be estimated that $3 \times 10^{15}$ (2 atomic layers)$\times 0.8 = 2.4 \times 10^{15}$ atoms/cm$^2$ of the atoms is deposited. In this connection, if the measurements of the XPS are previously calibrated by the ICP, the measurement accuracy by the XPS can be improved.

Furthermore, prior to the surface treatment of depositing the metal oxide, a corona discharge treatment, a glow discharge treatment, a surface chemical treatment, a coarsening treatment or the like can be carried out as an ordinary means of a person skilled in the art to further improve the adhesive properties between a gas barrier layer comprising the oxides of silicon which will be next formed and the polymeric molded article.

On the surface-treated surface formed in the above-mentioned manner in the present invention, the layer mainly comprising the oxides of silicon is formed. In place of the layer mainly comprising the oxides of silicon, a layer mainly comprising nitrides of silicon, or a layer mainly comprising carbides of silicon may be formed. The layer mainly comprising the silicon oxides which further contains silicon nitrides, silicon carbides or the like can also suitably be utilized. Examples of the formation method of the layer mainly comprising the oxides of silicon include a physical vapor deposition method, a chemical vapor deposition method and a wet method. Typically, examples of the physical vapor deposition method include a vacuum vapor deposition method, an ion plating method and a sputtering process, and examples of the chemical vapor deposition method include a thermal CVD method, a light CVD method and a plasma CVD method, and an example of the wet method is a sol-gel method. In the present invention, however, the substrate is typically the polymeric molded article, and so it is desirable that the film formation is accomplished at a relatively low temperature. Therefore, the physical vapor deposition method and the plasma CVD method are preferable. In particular, the layer mainly comprising the oxides of silicon can be suitably formed by the plasma CVD method or the sputtering process. The layer mainly comprising nitrides of silicon or the layer mainly comprising carbides of silicon can also suitably be formed in the same manner.

In the plasma CVD method, the layer is preferably formed by the use of at least an organic silicon compound gas and an oxygen gas. Typical examples of the usable organic silicon compound include methylmethoxysilane, tetramethoxysilane, tetramethyldisiloxane, hexamethyltrisiloxane and aromatic silane compounds, but they are not restrictive. In the case that the vapor pressure of the organic silicon compound is not sufficiently high at room temperature, a rare gas such as helium or argon is used as a carrier gas, and the organic silicon compound may be introduced into a vacuum chamber by bubbling.

No particular restriction is put on the sputtering process which is used to form the layer mainly comprising the oxides of silicon, and examples of the effectively usable sputtering process include a DC sputtering process, a DC magnetron sputtering process, an RF sputtering process, an RF magnetron sputtering process, an ion beam sputtering process and an electronic cyclotron resonance (ECR) sputtering process.

Next, the method for forming the layer mainly comprising the oxides of silicon by the sputtering process will be described.

A reactive sputtering which uses silicon or oxides of silicon as the target can be carried out by introducing a mixed gas of an argon gas and an oxygen gas as a sputtering gas into the vacuum chamber under a pressure of about 0.1 to 10 mTorr. A ratio between argon and oxygen in the mixed gas depends upon conditions of a film formation rate, a film thickness and the like. For example, in the case that silicon is used as the target, the partial pressure of oxygen to the total pressure is in the range of 10 to 60%, and in the case that the oxides of silicon is used as the target, the partial pressure of oxygen to the total pressure is in the range of 0 to 30%, whereby the layer mainly comprising the oxides of silicon can suitably be formed. In addition to oxygen, there can also be used nitrogen, hydrogen, methane or the like. For example, when the layer of silicon nitrides is formed, nitrogen is used, and when the layer of silicon carbides is formed, methane is used. Furthermore, in place of the argon gas which can be used as the sputtering gas, there may be used xenon, krypton, neon or a mixture thereof. No particular restriction is put on a frequency which can be used for discharge at the time of the sputtering, and in the case that a conductive target such as silicon is used, DC and AC can be employed, and in the case that an insulating target such as oxides of silicon or nitrides of silicon is used, AC can be employed. As the frequency of the AC, for example, a frequency of 20 Hz to 10 GHz can be used, and the practically preferable frequencies are particularly 50 Hz and 60 Hz which are frequencies of a commercial electric power as well as 13.56 MHz and 915 MHz which are ISM bands. However, the values of the frequencies for plasma generation inclusive of this DC do not impart restrictive conditions in the practice of the present invention. No particular restriction is put on an electric power for generating the plasma, and for example, 1 mW/cm$^2$ to 100 W/cm$^2$ can preferably be used in power density conversion.

No particular restriction is put on the thickness of the layer mainly comprising the oxides of silicon, and any thickness is acceptable, so long as it is such that the transparency is not impaired, the gas barrier properties are maintained and the adhesive properties to the polymeric molded article can be secured. Typically, the thickness of the layer mainly comprising the oxides of silicon is in the range of 20 nm to 500 nm, preferably 20 nm to 300 nm. If the thickness is less than 20 nm, it is difficult to form the uniform and continuous film, and on the other hand, if it is more than 500 nm, the adhesive properties to the polymeric substrate and the transparency to visible light deteriorate. As the measurement method of the film thickness, there are a method using a feeler coarse meter, a repeating reflective interference meter or a microbalance, and a quartz oscillator method. By this quartz oscillator method, the thickness can be measured during the formation of the film, and hence the quartz oscillator method is suitable to obtain the desired film thickness, by monitoring the thickness in real time. In addition, there can also be employed a method in which the film thickness can be controlled by a film formation time, but for this method, it is required that the conditions of the film formation are previously fixed, and the film is formed on a test substrate and a relation between the film formation time and the film thickness is then examined.

In the present invention, the formed layer of the oxides of silicon may contain an organic substance derived from the organic silicon compound. Furthermore, in order to completely carry out a reaction between the organic silicon compound gas which is a material gas and the oxygen gas, a plasma treatment may be carried out after the formation of the film.

A temperature at the surface treatment of the polymeric molded article, i.e., a temperature at the treatment of depositing, on the polymeric molded article, the metal oxide mainly comprising at least one metal selected from the group consisting of the metal elements in the group 2, 8, 9, 10 or 11, and a temperature at the formation of the layer mainly comprising the oxides of silicon may be either of a low temperature or a high temperature. The surface treatment and the layer formation under a high-temperature atmosphere can easily carried out by installing a heater at a position where the polymeric molded article is placed in a film formation device. No particular restriction is put on a temperature range, so long as the used polymeric molded article can withstand the temperature.

On the main surface of the thus formed laminate, a transparent conductive layer typified by an indium-tin oxide (ITO) is further laminated, thereby obtaining a substrate for a liquid crystal display. For the patterning of the transparent conductive layer, a photoresist layer is further formed, and in etching this transparent conductive layer, an alkali solution is used. Hence, the substrate for the liquid crystal display is required to have the alkali resistance, and it is necessary that neither the peeling of the laminate nor the generation of cracks should take place, even if the substrate is immersed preferably in an alkali solution having pH 12 or more, more preferably pH 13 or more, most preferably pH 14.

Thus, for the substrate for the liquid crystal display, an alkali resistance test will be made for the purpose of confirming the presence of the alkali resistance, and in this test, the immersion time of the substrate in the alkali solution is 1 minute, preferably 5 minutes, more preferably 10 minutes at room temperature. In a usual etching step, for example, the substrate is immersed in a 5 wt % aqueous potassium hydroxide solution for a period of several minutes. The laminate in which the surface treatment of the polymeric molded article has not been achieved by the deposition of the metal oxide has no alkali resistance, and hence the layer mainly comprising the oxides of silicon which is the gas barrier layer is peeled off from the surface of the polymeric molded article by the alkali solution at the time of the patterning of the transparent conductive layer. Therefore, all of the laminated film formed on the polymeric molded article is peeled off therefrom, and such a substrate cannot be admitted to be the laminate any more. On the contrary, in the laminate of the present invention, the above-mentioned surface treatment is carried out, and the gas barrier layer mainly comprising the oxides of silicon is then laminated thereon. Therefore, the laminate of the present invention is excellent in the alkali resistance, and even if it is immersed in the alkali of pH=12 or more, none of the peeling of the gas barrier layer, the generation of cracks and the like is observed.

In addition, even if immersed in the alkali solution of pH=14 which is one of conditions for use in etching in an actual step for manufacturing LCD (liquid crystal display) panels, the laminate of the present invention does not give rise to the peeling of the oxides of silicon, the generation of the cracks, and the like. A practical performance required for this kind of laminate is that the peeling of the gas barrier layer and the generation of the cracks do not occur, even if the laminate is immersed in a 5 wt % aqueous sodium hydroxide solution at room temperature for 10 minutes and in an etching solution ST-10 (made by Tokyo Ohka Kogyo Co., Ltd., a 35% monoethanolamine/diethylene glycol monobutyl ether solution) which is an organic alkali at 70° C. for 10 minutes, and the laminate of the present invention does not change even under the above-mentioned conditions.

EXAMPLES

Next, the present invention will be described in more detail with reference to examples and comparative examples.

For the formation of a laminate, there were used an HSM-521 sputtering device made by Shimadzu Co. and an SPP-001D plasma CVD device made by Showa Shinku Co., Ltd. For the formed laminates, items of oxygen permeability, moisture permeability, alkali resistance, light transmittance, heat resistance and peeling resistance were evaluated by the following procedures:

Oxygen permeability: This was measured in accordance with ASTM(American Society for Testing Materials)-D1434.

Moisture permeability: This was measured in accordance with ASTM-E96.

Alkali resistance: A laminate was immersed in a 5 wt % aqueous sodium hydroxide solution at room temperature or in an etching solution ST-10 (made by Tokyo Ohka Kogyo Co., Ltd.) at 70° C. for 10 minutes, and the surface of the laminate was then observed by the use of an optical microscope to confirm presence/absence of the peeling of a layer comprising oxides of silicon or the generation of cracks.

Light transmittance: The transmittance of parallel light beams at a wavelength of 550 nm was measured by the use of an HT-3400 type 2-wavelengths spectrometer made by Hitachi, Ltd.

Heat resistance test: A laminate was heated at 150° C., 180° C. or 200° C. for 1 hour under atmospheric pressure by the use of a DN-61 type fan thermo-hygrostat made by Yamato Science Co., Ltd., and the surface of the laminate was then observed by the use of an optical microscope to confirm presence/absence of peeling of the layer comprising oxides of silicon or the generation of cracks.

Peeling resistance: This was measured in accordance with JIS(Japanese Industrial Standard)-K5400.

Incidentally, the scope of the present invention should not be limited to the examples and the comparative examples at all.

Example 1

On a polycarbonate film having a thickness of 100 μm, a surface treatment was carried out so that the amount of palladium to be deposited on its surface might be $6\times10^{15}$ atoms/cm$^2$ by a sputtering process using palladium as a target. Afterward, this polycarbonate film was arranged in a plasma CVD device having parallel plate type electrodes, and an oxygen gas was introduced into this plasma CVD device to generate plasma discharge at a radio frequency of 13.56 MHz, whereby an oxygen plasma treatment was applied to the palladium layer to convert the palladium layer into an oxide layer. Next, helium was used as a carrier gas, and tetramethyldisiloxane (hereinafter abbreviated to "TMDSO") and oxygen were used as raw material gases. At this time, the plasma discharge was generated by the same plasma CVD device to form a film of oxides of silicon having a thickness of 150 nm on the oxide layer, thereby obtaining a laminate. In this connection, it was confirmed by analysis using an X-ray photo-electron spectrometry (XPS) that the deposited palladium was converted into the oxide.

The oxygen permeabilities of the thus obtained laminate and the polycarbonate film which was the used substrate were measured. As a result, the oxygen permeability of the laminate was 0.30 cc·m$^{-2}$·day$^{-1}$·atm$^{-1}$, and that of the substrate was 3.2 cc·m$^{-2}$·day$^{-1}$·atm$^{-1}$. Next, moisture permeabilities were measured, and as a result, the moisture permeability of the laminate was 0.039 g·m$^{-2}$·day$^{-1}$·atm$^{-1}$ and that of the substrate was 0.28 g·m$^{-2}$·day$^{-1}$·atm$^{-1}$.

Example 2

The same procedure as in Example 1 was repeated except that magnesium was used as a target for sputtering and a surface treatment was carried out so that the amount of magnesium to be deposited on a surface by a sputtering process might be $1\times10^{16}$ atoms/cm$^2$ and the thickness of a layer comprising oxides of silicon was 200 nm, thereby obtaining a laminate. For the thus obtained laminate, oxygen permeability and moisture permeability were measured, and as a result, they were 0.34 cc·m$^{-2}$·day$^{-1}$·atm$^{-1}$ and 0.045 g·m$^{-2}$·day$^{-1}$·atm$^{-1}$, respectively.

Example 3

The same procedure as in Example 2 was repeated except that after the formation of a magnesium layer, an oxygen plasma treatment was not carried out, thereby obtaining a laminate. The oxygen plasma treatment was not made, but oxygen was used as a raw material gas in forming a layer of silicon oxides to accomplish conversion of magnesium into an oxide. For the thus obtained laminate, oxygen permeability and moisture permeability were measured, and as a result, they were 0.42 cc·m$^{-2}$·day$^{-1}$·atm$^{-1}$ and 0.052 g·m$^{-2}$·day$^{-1}$·atm$^{-1}$, respectively.

Example 4

The same procedure as in Example 1 was repeated except that copper was used as a target for sputtering and a surface treatment was carried out so that the amount of copper to be deposited on a surface by a sputtering process might be $6\times10^{15}$ atoms/cm$^2$ and the thickness of a layer of silicon oxides was 200 nm, thereby obtaining a laminate. For the thus obtained laminate, oxygen permeability and moisture permeability were measured, and as a result, they were 0.27 $cc \cdot m^{-2} \cdot day^{-1} \cdot atm^{-1}$ and 0.033 $g \cdot m^{-2} \cdot day^{-1} \cdot atm^{-1}$, respectively.

Example 5

The same procedure as in Example 4 was repeated except that polyether sulfone film (made by Mitsui Toatsu Chemicals, Inc., TALPA-1000; thickness=50 μm) was used as a polymeric molded article, thereby obtaining a laminate. For the thus obtained laminate, oxygen permeability and moisture permeability were measured, and as a result, they were 0.30 $cc \cdot m^{-2} \cdot day^{-1} \cdot atm^{-1}$ and 0.039 $g \cdot m^{-2} \cdot day^{-1} \cdot atm^{-1}$, respectively.

Example 6

46.7 parts by weight of 3-isopropenyl-α,α-dimethylbenzyl isocyanate was mixed with 32.7 parts by weight of tris(acryloyloxyethyl) isocyanurate, and 0.03 part by weight of dibutyltin dilaurate was then added. Next, an internal temperature was maintained at 60° C., and 29.9 parts by weight of 2-hydroxyethyl methacrylate was slowly added thereto. After reaction was carried out at the same temperature for 2 hours, 13.9 parts by weight of neopentyl glycol dimethacrylate was mixed. To the resulting monomer, 1.16 parts by weight of t-butylperoxy-2-ethyl hexanonate was added, and while mixing, defoaming was done. Next, the defoamed monomer solution was poured into a space portion of a cast in which two glass plates having a size of 200 mm×300 mm might be regulated with a sheet-like gasket of a silicone rubber so that a space distance between these glass plates might be 0.4 mm, and the cast was then placed in a hot-air oven and then heated in an increasing temperature manner from 60° C. to 180° C. to carry out polymerization for 3 hours, thereby obtaining a resin (thickness=0.4 mm) having a three-dimensional crosslinked structure.

The same procedure as in Example 1 was repeated except that this resin was used as a polymeric molded article, thereby obtaining a laminate. For the thus obtained laminate, oxygen permeability and moisture permeability were measured, and as a result, they were 0.25 $cc \cdot m^{-2} \cdot day^{-1} \cdot atm^{-1}$ and 0.037 $g \cdot m^{-2} \cdot day^{-1} \cdot atm^{-1}$, respectively.

Example 7

The same procedure as in Example 6 was repeated except that ruthenium was used as a target for sputtering and a surface treatment was carried out so that the amount of ruthenium to be deposited on a surface by a sputtering process might be $6 \times 10^{15}$ atoms/cm², thereby obtaining a laminate. For the thus obtained laminate, oxygen permeability and moisture permeability were measured, and as a result, they were 0.29 $cc \cdot m^{-2} \cdot day^{-1} \cdot atm^{-1}$ and 0.034 $g \cdot m^{-2} \cdot day^{-1} \cdot atm^{-1}$, respectively.

Example 8

The same procedure as in Example 6 was repeated except that iridium was used as a target for sputtering and a surface treatment was carried out so that the amount of iridium to be deposited on a surface by a sputtering process might be $6 \times 10^{15}$ atoms/cm², thereby obtaining a laminate. For the thus obtained laminate, oxygen permeability and moisture permeability were measured, and as a result, they were 0.30 $cc \cdot m^{-2} \cdot day^{-1} \cdot atm^{-1}$ and 0.025 $g \cdot m^{-2} \cdot day^{-1} \cdot atm^{-1}$, respectively.

Example 9

The same procedure as in Example 6 was repeated except that magnesium-copper alloy ($Mg_2Cu$, Mg/Cu=2/1 in an atomic ratio) was used as a target for sputtering and a surface treatment was carried out so that the total amount of magnesium and copper to be deposited on a surface by a sputtering process might be $6 \times 10^{15}$ atoms/cm², thereby obtaining a laminate. For the thus obtained laminate, oxygen permeability and moisture permeability were measured, and as a result, they were 0.28 $cc \cdot m^{-2} \cdot day^{-1} \cdot atm^{-1}$ and 0.038 $g \cdot m^{-2} \cdot day^{-1} \cdot atm^{-1}$, respectively.

Example 10

On a polycarbonate film having a thickness of 100 μm, a surface treatment was carried out so that the amount of palladium to be deposited on its surface might be $1 \times 10^{16}$ atoms/cm² by a sputtering process using palladium as a target. Afterward, an oxygen gas was then introduced into the vacuum chamber in which the polycarbonate film was placed to generate plasma discharge, whereby an oxygen plasma treatment was applied to the metal on the film surface to convert the metal layer into an oxide layer. Next, silicon oxides were used as a target, and an argon gas which was a sputtering gas and additionally an oxygen gas were introduced into the vacuum chamber so that the partial pressure of oxygen to the total pressure might be 10%, and a layer of silicon oxides having a thickness of 200 nm was formed by the sputtering process, thereby obtaining a laminate. In this connection, it was confirmed by analysis using an X-ray photo-electron spectrometry that the deposited palladium was converted into the oxide. For the thus obtained laminate, oxygen permeability and moisture permeability were measured, and as a result, they were 0.31 $cc \cdot m^{-2} \cdot day^{-1} \cdot atm^{-1}$ and 0.040 $g \cdot m^{-2} \cdot day^{-1} \cdot atm^{-1}$, respectively.

Example 11

On a polycarbonate film having a thickness of 100 μm, a surface treatment was carried out so that the amount of palladium to be deposited on its surface might be $1 \times 10^{16}$ atoms/cm² by a sputtering process using palladium as a target. Afterward, an oxygen gas was then introduced into the vacuum chamber in which the polycarbonate film was placed to generate plasma discharge, whereby an oxygen plasma treatment was applied to the metal on the film surface to convert the metal layer into an oxide layer. Next, silicon (which was doped with boron, a high-resistance article) was used as a target, and an argon gas which was a sputtering gas and additionally a nitrogen gas were introduced into the vacuum chamber so that the partial pressure of nitrogen to the total pressure might be 50%, and a layer of silicon nitrides having a thickness of 200 nm was formed by the sputtering process, thereby obtaining a laminate. In this connection, it was confirmed by analysis using an X-ray photo-electron spectrometry that the deposited palladium was converted into the oxide. For the thus obtained laminate, oxygen permeability and moisture permeability were measured, and as a result, they were 0.29 $cc \cdot m^{-2} \cdot day^{-1} \cdot atm^{-1}$ and 0.041 $g \cdot m^{-2} \cdot day^{-1} \cdot atm^{-1}$, respectively.

Example 12

The same procedure as in Example 10 was repeated except that an alloy SUS 304 mainly comprising iron was used as a target for sputtering and a surface treatment was carried out so that the amount of metals to be deposited on a surface by a sputtering process might be $1 \times 10^{16}$ atoms/$cm^2$, thereby obtaining a laminate. For the thus obtained laminate, oxygen permeability and moisture permeability were measured, and as a result, they were 0.28 $cc \cdot m^{-2} \cdot day^{-1} \cdot atm^{-1}$ and 0.034 $g \cdot m^{-2} \cdot day^{-1} \cdot atm^{-1}$, respectively.

Example 13

The same procedure as in Example 10 was repeated except that cobalt was used as a target for sputtering and a surface treatment was carried out so that the amount of the metal to be deposited on a surface by a sputtering process might be $1 \times 10^{16}$ atoms/$cm^2$, thereby obtaining a laminate. For the thus obtained laminate, oxygen permeability and moisture permeability were measured, and as a result, they were 0.29 $cc \cdot m^{-2} \cdot day^{-1} \cdot atm^{-1}$ and 0.038 $g \cdot m^{-2} \cdot day^{-1} \cdot atm^{-1}$, respectively.

Example 14

The same procedure as in Example 10 was repeated except that an alloy Inconel 625 mainly comprising nickel was used as a target for sputtering and a surface treatment was carried out so that the amount of the metal to be deposited on a surface by a sputtering process might be $1 \times 10^{16}$ atoms/$cm^2$, thereby obtaining a laminate. For the thus obtained laminate, oxygen permeability and moisture permeability were measured, and as a result, they were 0.34 $cc \cdot^{-2} \cdot day^{-1} \cdot atm^{-1}$ and 0.056 $g \cdot m^{-2} \cdot day^{-1} \cdot atm^{-1}$, respectively.

Comparative Example 1

A plasma CVD device having parallel plate type electrodes was used, and plasma discharge was generated at a radio frequency of 13.56 MHz by the use of helium as a carrier gas as well as TMDSO and oxygen as raw material gases to directly form a layer of silicon oxides having a thickness of 200 nm on a polycarbonate film having a thickness of 100 μm, thereby obtaining a laminate. For the thus obtained laminate, oxygen permeability and moisture permeability were measured, and as a result, they were 0.42 $cc \cdot m^{-2} \cdot day^{-1} \cdot atm^{-1}$ and 0.052 $g \cdot m^{-2} \cdot day^{-1} \cdot atm^{-1}$, respectively.

Comparative Example 2

Silicon oxide was used as a target, and a sputtering process was carried out in which an argon gas as a sputtering gas and additionally an oxygen gas were used so that the partial pressure of oxygen to the total pressure might be 10%, whereby a layer of silicon oxides having a thickness of 200 nm was formed on a polycarbonate film having a thickness of 100 μm, thereby obtaining a laminate.

Comparative Example 3

Silicon (which was doped with boron, a high-resistance article) was used as a target, and a sputtering process was carried out in which an argon gas as a sputtering gas and additionally a nitrogen gas were used so that the partial pressure of nitrogen to the total pressure might be 50%, whereby a layer of silicon nitrides having a thickness of 200 nm was formed on a polycarbonate film having a thickness of 100 μm, thereby obtaining a laminate.

Comparative Example 4

A plasma CVD device having parallel plate type electrodes was used, and plasma discharge was generated at a radio frequency of 13.56 MHz by the use of helium as a carrier gas as well as TMDSO and oxygen as raw material gases to form a layer of silicon oxides having a thickness of 200 nm on a polyether sulfone film (made by Mitsui Toatsu Chemicals, Inc., TALPA-1000; thickness 50 μm), thereby obtaining a laminate.

Comparative Example 5

A plasma CVD device having parallel plate type electrodes was used, and plasma discharge was generated at a radio frequency of 13.56 MHz by the use of helium as a carrier gas as well as TMDSO and oxygen as raw material gases to form a layer of silicon oxides having a thickness of 200 nm on a resin (thickness=0.4 mm) having a three-dimensional crosslinked structure used in Example 6, thereby obtaining a laminate.

Table 1 shows the measurement results of light transmittance at a wavelength of 550 nm and the evaluation results of an alkali resistance test and a peeling resistance test which were carried out for the laminates obtained in the examples and the comparative examples. Table 1 also shows judgment results as to whether or not each laminate had a practical performance on the basis of the results of the alkali resistance test. Furthermore, since the resins having the three-dimensional crosslinked structure used in Examples 6 to 9 and Comparative Example 3 exerted excellent heat resistance, and thus, for these laminates, a heat resistance test was carried out. The results are shown in Table 2.

TABLE 1

| Sample | Light transmittance (%) | Alkali Resistance Test NaOH | ST-10 | Peeling Resistance Test | Judgment |
|---|---|---|---|---|---|
| Example 1 | 90.1 | Not Changed | Not Changed | Not Peeled | Usable |
| Example 2 | 90.2 | Not Changed | Not Changed | Not Peeled | Usable |
| Example 3 | 90.2 | Not Changed | Not Changed | Not Peeled | Usable |
| Example 4 | 90.1 | Not Changed | Not Changed | Not Peeled | Usable |
| Example 5 | 90.2 | Not Changed | Not Changed | Not Peeled | Usable |
| Example 6 | 90.6 | Not Changed | Not Changed | Not Peeled | Usable |
| Example 7 | 90.5 | Not Changed | Not Changed | Not Peeled | Usable |
| Example 8 | 90.5 | Not Changed | Not Changed | Not Peeled | Usable |
| Example 9 | 90.8 | Not Changed | Not Changed | Not Peeled | Usable |
| Example 10 | 88.7 | Not Changed | Not Changed | Not Peeled | Usable |
| Example 11 | 88.5 | Not Changed | Not Changed | Not Peeled | Usable |
| Example 12 | 90.0 | Not Changed | Not Changed | Not Peeled | Usable |
| Example 13 | 90.3 | Not Changed | Not Changed | Not Peeled | Usable |

TABLE 1-continued

| Sample | Light transmittance (%) | Alkali Resistance Test NaOH | Alkali Resistance Test ST-10 | Peeling Resistance Test | Judgment |
|---|---|---|---|---|---|
| Example 14 | 90.1 | Not Changed | Not Changed | Not Peeled | Usable |
| Comp. Example 1 | 91.6 | Peeled | Peeled | Not Peeled | Not Usable |
| Comp. Example 2 | 90.8 | Peeled | Peeled | Not Peeled | Not Usable |
| Comp. Example 3 | 92.3 | Peeled | Peeled | Not Peeled | Not Usable |
| Comp. Example 4 | 91.2 | Peeled | Peeled | Not Peeled | Not Usable |
| Comp. Example 5 | 90.3 | Peeled | Peeled | Not Peeled | Not Usable |

TABLE 2

| Sample | Heat Resistance Test Temperature (°C.) 150 | 180 | 200 |
|---|---|---|---|
| Example 6 | Not Changed | Not Changed | Not Changed |
| Example 7 | Not Changed | Not Changed | Not Changed |
| Example 8 | Not Changed | Not Changed | Not Changed |
| Example 9 | Not Changed | Not Changed | Not Changed |
| Comp. Example 5 | Not Changed | Not Changed | Cracked |

From the above-mentioned evaluation results, it is apparent that a laminate which is excellent in light transparency and gas barrier properties and in which an alkali resistance is also improved can be obtained by carrying out a surface treatment to deposit, on the surface of a polymeric molded article, an oxide of at least one metal selected from the group consisting of the metal elements in the group 2, 8, 9, 10 or 11 of the periodic table, and then forming a layer mainly comprising oxides of silicon or a layer mainly comprising nitrides of silicon on the treated surface.

What is claimed is:

1. A laminate which is obtained by conducting a surface treatment to deposit an oxide of at least one metal selected from the group consisting of metals in groups 2, 8, 9, 10 and 11 of the periodic table on at least one surface of a polymeric molded article, wherein the amount of metal oxide deposited on the surface of the polymeric molded article is in the range of $5 \times 10^{14}$ atoms/cm$^2$ to $3 \times 10^{16}$ atoms/cm$^2$ in terms of the amount of the metal atoms per unit area that has been surface treated, and then forming a gas barrier layer on the surface which has been surface treated, wherein the gas barrier layer is constituted of any of a layer mainly comprising an oxide of silicon, a layer mainly comprising a nitride of silicon or a layer mainly comprising a carbide of silicon, and the gas barrier layer is not peeled off from the polymeric molded article, even after being immersed in an alkali solution of pH 12 or more.

2. The laminate according to claim 1 wherein the metal is magnesium, iron, cobalt, nickel or copper.

3. The laminate according to claim 1 wherein the gas barrier layer mainly comprises an oxide of silicon.

4. The laminate according to claim 3 wherein the polymeric molded article is a transparent polymeric molded article.

5. The laminate according to claim 1 wherein the polymeric molded article is a transparent polymeric molded article.

6. A method for preparing a laminate described in claim 5 which comprises a step of depositing at least one metal selected from the group consisting of metals in groups 2, 8, 9, 10 and 11 of the periodic table on at least one surface of a polymeric molded article, and then treating it under an oxidizing atmosphere, whereby said at least one surface becomes a metal oxide treated surface wherein the amount of metal oxide deposited on the surface of the polymeric molded article is in the range of $5 \times 10^{14}$ atoms/cm$^2$ to $3 \times 10^{16}$ atoms/cm$^2$ in terms of the amount of the metal atoms per unit area that has been surface treated, and a step of forming a gas barrier layer constituted of any of a layer mainly comprising an oxide of silicon, a layer mainly comprising a nitride of silicon or a layer mainly comprising a carbide of silicon on the treated surface.

7. The method according to claim 6 wherein the any one of the layer mainly comprising the oxide of silicon, the layer mainly comprising the nitride of silicon or the layer mainly comprising the carbide of silicon is formed by a plasma CVD method of an organic silicon compound.

8. The method according to claim 6 wherein the any one of the layer mainly comprising the oxide of silicon, the layer mainly comprising the nitride of silicon or the layer mainly comprising the carbide of silicon is formed by a sputtering process.

9. The method according to claim 6 wherein the treatment under the oxidizing atmosphere is an oxygen plasma treatment.

10. A method for preparing a laminate described in claim 2 which comprises a step of depositing at least one metal selected from the group consisting of magnesium, iron, cobalt, nickel, and copper on at least one surface of a polymeric molded article, and then treating it under an oxidizing atmosphere, whereby said at least one surface becomes a metal oxide treated surface wherein the amount of metal oxide deposited on the surface of the polymeric molded article is in the range of $5 \times 10^{14}$ atoms/cm$^2$ to $3 \times 10^{16}$ atoms/cm$^2$ in terms of the amount of the metal atoms per unit area that has been surface treated, and a step of forming a gas barrier layer constituted of any of a layer mainly comprising an oxide of silicon, a layer mainly comprising a nitride of silicon or a layer mainly comprising a carbide of silicon on the treated surface.

11. The method according to claim 10 wherein the any one of the layer mainly comprising the oxide of silicon, the layer mainly comprising the nitride of silicon.

12. The method according to claim 10 wherein the any one of the layer mainly comprising the oxide of silicon, the layer mainly comprising the nitride of silicon or the layer mainly comprising the carbide of silicon is formed by a sputtering process.

13. The method according to claim 10 wherein the treatment under the oxidizing atmosphere is an oxygen plasma treatment.

14. A method for preparing a laminate described in claim 1 which comprises a step of depositing at least one metal selected from the group consisting of metals in groups 2, 8, 9, 10 and 11 of the periodic table on at least one surface of a polymeric molded article, and then treating it under an oxidizing atmosphere, whereby said at least one surface becomes a metal oxide treated surface wherein the amount of metal oxide deposited on the surface of the polymeric molded article is in the range of $5\times10^{14}$ atoms/cm$^2$ to $3\times10^{16}$ atoms/cm$^2$ in terms of the amount of the metal atoms per unit that has been treated, and a step of forming a gas barrier layer constituted of any of a layer mainly comprising an oxide of silicon, a layer mainly comprising a nitride of silicon or a layer mainly comprising a carbide of silicon on the treated surface.

15. The method according to claim 14 wherein the any one of the layer mainly comprising the oxide of silicon, the layer mainly comprising the nitride of silicon or the layer mainly comprising the carbide of silicon is formed by a plasma CVD method of an organic silicon compound.

16. The method according to claim 14 wherein the any one of the layer mainly comprising the oxide of silicon, the layer mainly comprising the nitride of silicon or the layer mainly comprising the carbide of silicon is formed by a sputtering process.

17. The method according to claim 14 wherein the treatment under the oxidizing atmosphere is an oxygen plasma treatment.

\* \* \* \* \*

UNITED STATES PATENT AND TRADEMARK OFFICE
CERTIFICATE OF CORRECTION

PATENT NO. : 5,820,994

DATED: : October 13, 1998

INVENTOR(S) : Yumi GOTOH et al

It is certified that error appears in the above-identified patent and that said Letters Patent is hereby corrected as shown below:

Please amend claim 11, as set forth in the Preliminary Amendment as claim 21 as follows:

11. The method according to claim 10 wherein the any one of the layer mainly comprising the oxide of silicon, the layer mainly comprising the nitride of silicon <u>or the layer mainly comprising the carbide of silicon is formed by a plasma CVD method of an organic silicon compound.</u>

Signed and Sealed this

Twenty-fourth Day of August, 1999

*Attest:*

Q. TODD DICKINSON

*Attesting Officer*      *Acting Commissioner of Patents and Trademarks*